(12) United States Patent
Hooker et al.

(10) Patent No.: US 12,431,699 B2
(45) Date of Patent: Sep. 30, 2025

(54) CABLE GLAND

(71) Applicant: Schaeffler Technologies AG & Co. KG, Herzogenaurach (DE)

(72) Inventors: Craig Hooker, Indian Land, SC (US); Jason Hoover, Charlotte, NC (US)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 263 days.

(21) Appl. No.: 18/073,614

(22) Filed: Dec. 2, 2022

(65) Prior Publication Data

US 2023/0387673 A1 Nov. 30, 2023

Related U.S. Application Data

(60) Provisional application No. 63/346,356, filed on May 27, 2022.

(51) Int. Cl.
| | |
|---|---|
| *H02G 15/04* | (2006.01) |
| *F16H 1/10* | (2006.01) |
| *F16H 49/00* | (2006.01) |
| *F16H 55/08* | (2006.01) |
| *F16H 55/17* | (2006.01) |
| *F16H 57/023* | (2012.01) |
| *F16H 57/029* | (2012.01) |
| *F16H 57/02* | (2012.01) |
| *H02K 5/10* | (2006.01) |
| *H05K 7/14* | (2006.01) |

(52) U.S. Cl.
CPC .............. *F16H 57/023* (2013.01); *F16H 1/10* (2013.01); *F16H 49/001* (2013.01); *F16H 55/0833* (2013.01); *F16H 55/17* (2013.01); *F16H 57/029* (2013.01); *F16H 2057/02034* (2013.01); *H02K 5/10* (2013.01); *H05K 7/1427* (2013.01)

(58) Field of Classification Search
CPC .... H02G 15/04; H02G 15/043; H02G 15/046; H02G 15/013; H02G 15/007; H02G 3/0616–0691; H01R 13/59; H01R 13/187; H01R 13/6584; H01R 13/58; H01R 13/652–6599; H01R 4/646
See application file for complete search history.

(56) References Cited

U.S. PATENT DOCUMENTS

| | | | | |
|---|---|---|---|---|
| 4,525,000 | A * | 6/1985 | Bachle | H02G 3/0675 174/653 |
| 4,692,561 | A * | 9/1987 | Nattel | H02G 15/013 174/653 |
| 5,920,035 | A * | 7/1999 | Haney | H02G 3/22 174/152 G |
| 6,268,565 | B1 * | 7/2001 | Daoud | H02G 3/0675 174/657 |
| 8,490,513 | B2 * | 7/2013 | Chiou | H02G 3/0675 174/520 |
| 2012/0024590 | A1 | 2/2012 | Chiou | |

(Continued)

*Primary Examiner* — Roshn K Varghese
(74) *Attorney, Agent, or Firm* — Matthew V Evans

(57) ABSTRACT

A cable gland includes a body, a cover, and an insert. The body is configured to be received in an opening of a housing. The body has a tube defining a first cavity extending circumferentially about an axis. The cover is threadedly engaged with the tube and configured to seal the body to the housing. The insert is disposed in the first cavity and defines a second cavity configured to receive a cable. The insert includes a plurality of ribs engaged with the tube.

16 Claims, 3 Drawing Sheets

(56) References Cited

U.S. PATENT DOCUMENTS

| | | |
|---|---|---|
| 2014/0030903 A1 | 1/2014 | Magno et al. |
| 2015/0083486 A1 | 3/2015 | Hill et al. |
| 2015/0137456 A1 | 5/2015 | Lund |
| 2016/0123002 A1 | 5/2016 | Münzenberger et al. |

* cited by examiner

CABLE GLAND

CROSS-REFERENCE TO RELATED APPLICATIONS

This application claims the benefit of U.S. Provisional Patent Application No. 63/346,356, filed May 27, 2022, the disclosure of which is incorporated in its entirety by reference herein.

TECHNICAL FIELD

The present disclosure relates generally to a cable gland, and more specifically to a cable gland including a body and an insert including a plurality of ribs engaged with the body.

BACKGROUND

A housing of an assembly, e.g., an actuator, may include openings configured to receive a cable, which may be configured to provide power to electronics within the housing of the assembly. Cable glands are configured to seal the cable to the housing in the opening. However, the cable gland may be improperly sealed to one of the cable or the housing, e.g., due to misalignment of a component seal and/or manufacturing tolerances. Due to possible fluid leakage through an improperly sealed cable gland, it is desirable to have alternate designs and configurations to seal a cable to a housing via a cable gland.

SUMMARY

Embodiments of the present disclosure provides a cable gland including a body, a cover, and an insert. The body is configured to be received in an opening of a housing. The body has a tube defining a first cavity extending circumferentially about an axis. The cover is threadedly engaged with the tube and configured to seal the body to the housing. The insert is disposed in the first cavity and defines a second cavity configured to receive a cable. The insert includes a plurality of ribs engaged with the tube.

In embodiments, a diameter of the second cavity may be smaller than a diameter of the first cavity. In embodiments, the first cavity may be arranged coaxially with the second cavity.

In embodiments, the cover may include a top having a further opening extending therethrough. The further opening may be arranged coaxially with the first cavity. The second cavity and the further opening may have smaller diameters than the first cavity. The diameter of the second cavity may be smaller than the diameter of the further opening. The insert may contact the top entirely around the further opening.

In embodiments, the ribs may be axially spaced from each other. In embodiments, the ribs may be configured to seal the insert to the tube. In embodiments, the ribs may be configured to contact the tube entirely about the axis.

In embodiments, the cable gland may include a seal extending circumferentially about the tube. The seal may be configured to be compressed between the cover, the tube, and the housing.

In embodiments, the body may include a base axially spaced from the cover and extending radially inward of the first cavity. One of the ribs may be arranged to contact the base circumferentially about the axis. The cover may include a top extending radially inward of the first cavity. The insert may contact the top circumferentially about the axis.

In embodiments, each rib may extend circumferentially about the axis. In embodiments, the insert may be configured to contact the cable entirely about the axis.

In embodiments, a diameter of the insert at one of the ribs may be greater than a diameter of the cavity. In embodiments, a diameter of the second cavity may be smaller than a diameter of the cable. In embodiments, the insert may be configured to radially expand when the cable is inserted into the second cavity. In embodiments, the ribs may be axially spaced from each other. The ribs may be configured to axially expand when the insert is inserted into the first cavity.

Embodiments of the present disclosure further provides a method for installing a cable gland. The cable gland includes a body and an insert disposed in the body. The insert defines a second cavity configured to receive a cable and includes a plurality of ribs engaged with the body. The method includes providing a housing defining a cavity and an opening in fluid communication with the cavity. The method further includes inserting the body into the opening via the cavity. The method further includes installing a cable into the insert. The insert is radially deformed by the cable during installation. The method further includes installing the insert into the body. The ribs are axially deformed by the body during installation.

DETAILED DESCRIPTION

Embodiments of the present disclosure are described herein. It should be appreciated that like drawing numbers appearing in different drawing views identify identical, or functionally similar, structural elements. Also, it is to be understood that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The terminology used herein is for the purpose of describing particular aspects only, and is not intended to limit the scope of the present disclosure. Unless defined otherwise, all technical and scientific terms used herein have the same meaning as commonly understood to one of ordinary skill in the art to which this disclosure belongs. Although any methods, devices or materials similar or equivalent to those described herein can be used in the practice or testing of the disclosure, the following example methods, devices, and materials are now described.

Cable glands may include a body configured to receive a cable, a seal, and a cover configured to compress the seal between the body, the cover and a housing of an assembly. However, misalignment of one of the components and/or manufacturing tolerances can prevent the cable gland from effectively sealing the cable to the housing. Advantageously, a cable gland, in one exemplary embodiment of the present disclosure, includes an insert configured to receive the cable. The insert includes a plurality of ribs engaged with the body of the cable gland. Providing an insert having a plurality of ribs allows for deformation of the insert and the ribs when the cable is received in the cable gland, which can increase a likelihood of the insert being sealed to the body thereby decreasing a likelihood of fluid intrusion through the cable gland.

Figure 1:
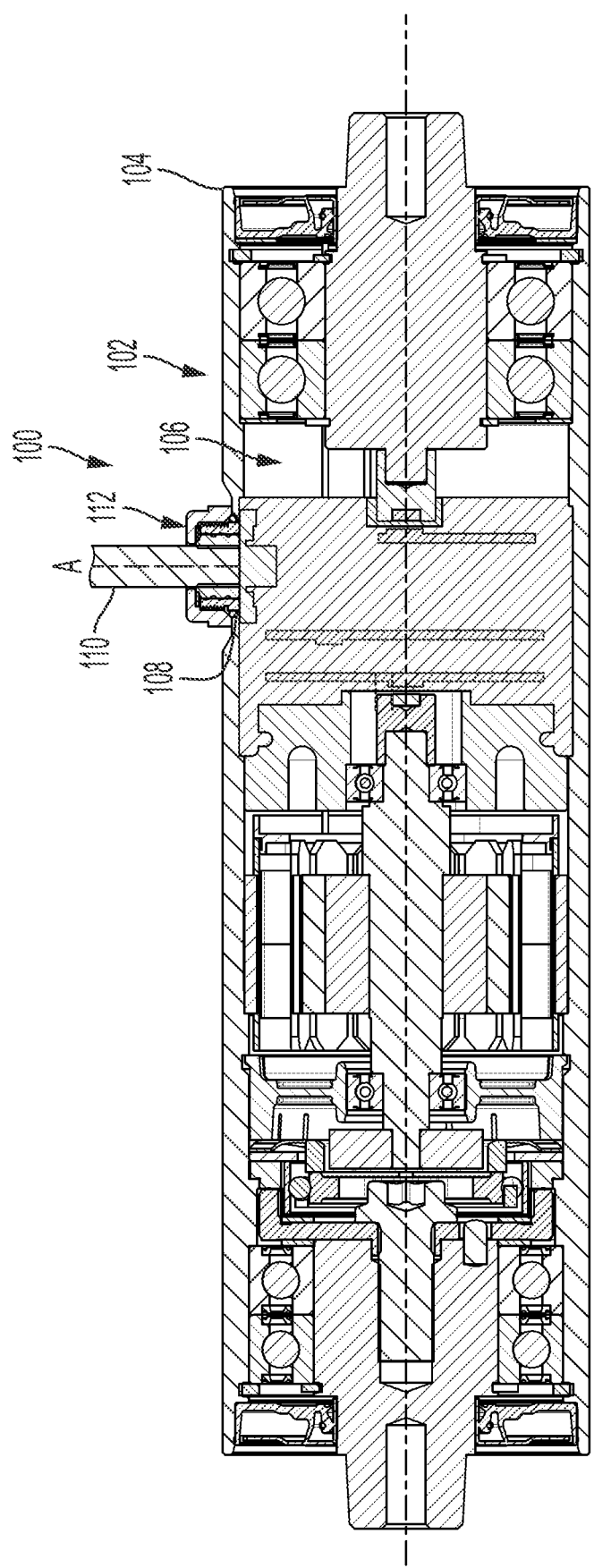
FIG. 1 illustrates a cross-sectional view of an exemplary rotary actuator.
Figure 2:
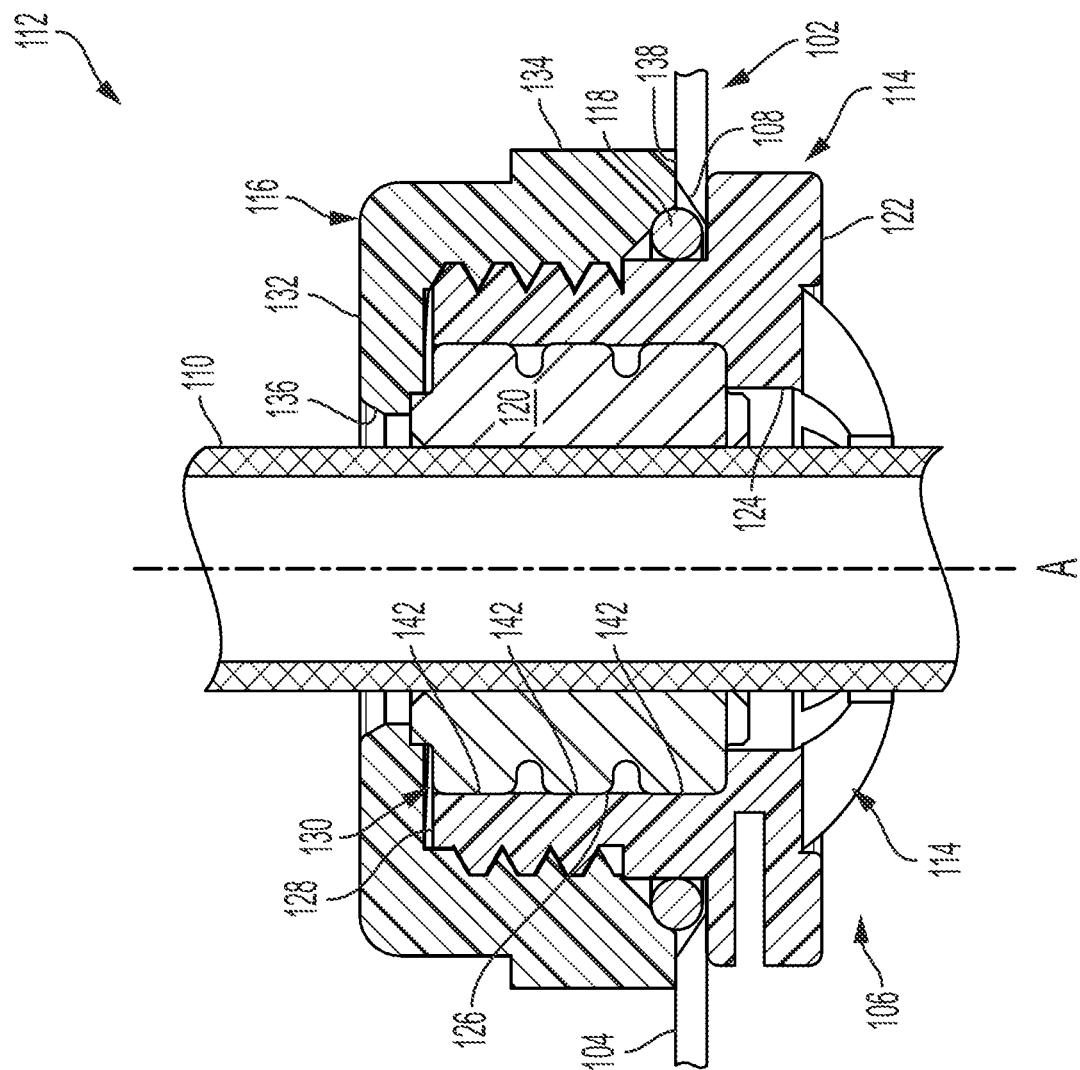
FIG. 2 illustrates a magnified cross-sectional view of a cable gland shown in FIG. 1.
Figure 3:
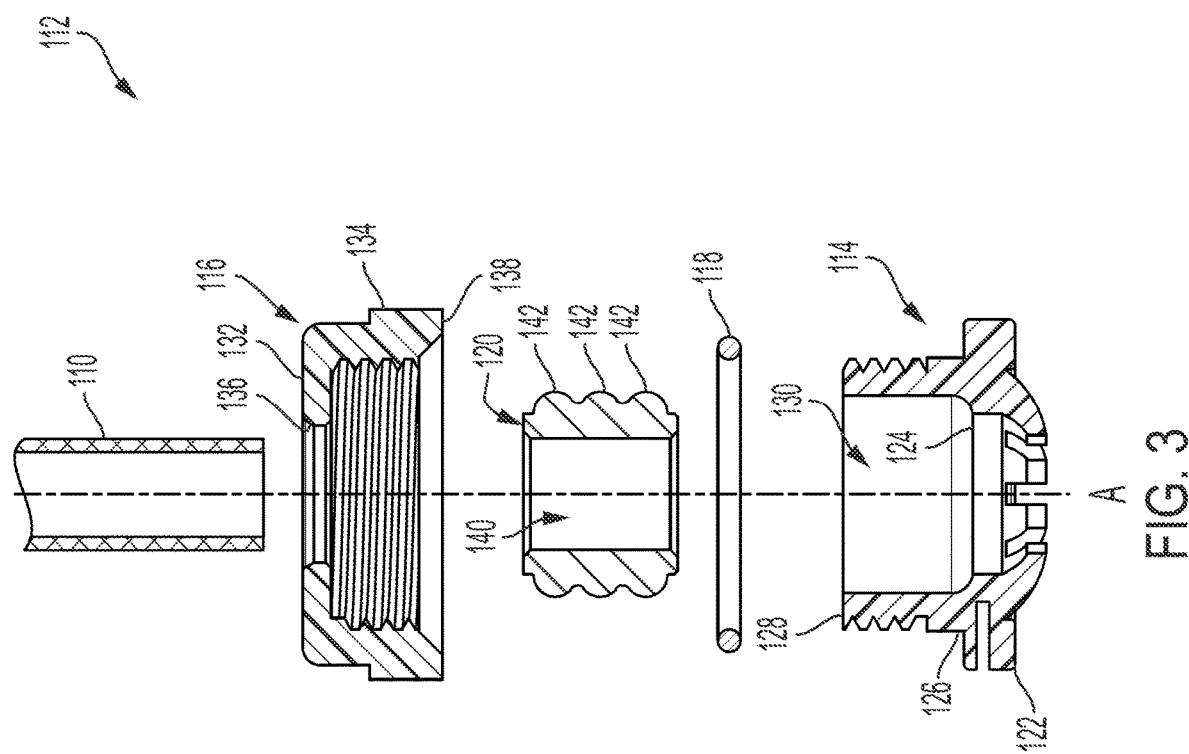
FIG. 3 is a cross-sectional view of the cable gland in an uninstalled state.

With reference to FIGS. 1-3, an actuator 100 is generally shown. The actuator 100 includes a housing 102 and a plurality of components housed, at least partially, therein. The housing 102 includes a wall 104 defining a cavity 106. The wall 104 includes an opening 108 extending through the wall 104 along an axis A.

The actuator 100 includes a cable 110 extending through the opening 108. The cable 110 includes one or more wires configured to provide electricity to one or more components of the actuator 100, e.g., a sensor, a motor (e.g., an alternating current motor, a direct current motor, etc.), a computing device, etc.

The actuator 100 may include a cable gland 112 disposed in the opening 108. That is, the opening 108 may be designed to receive the cable gland 112. The cable gland 112 is configured to seal the cable 110 to the wall 104 in the opening 108. The cable gland 112 may be arranged coaxially with the opening 108. The cable gland 112 includes: a body 114; a cover 116; a seal 118; and an insert 120. The components of the cable gland 112 may be any suitable material or combination of materials, e.g., rubber, plastic, metal, etc.

The body 114 may include a base 122 disposed in the cavity 106. The base 122 may extend radially outward of the opening 108 relative to the axis A. The base 122 may be configured to engage an axial surface (not numbered) of the housing 102, e.g., to axially constrain the body 114 relative to the housing 102. The base 122 may define an first opening 124 arranged coaxially with the axis A. The first opening 124 may extend axially through the base 122. The first opening 124 may extend circumferentially about the axis A. The first opening 124 may be designed, i.e., sized and shaped, to receive the cable 110. For example, a diameter of the first opening 124 may be larger than a diameter of the cable 110. The diameter of the first opening 124 may be smaller than a diameter of the opening 108.

The base 122 may include a plurality of fingers (not numbered) extending obliquely from the base 122 relative to the axis A. The fingers may spaced from each other about the axis A. The fingers may be arranged at the first opening 124. The fingers may extend towards the axis A and into the cavity 106. Each finger may include an end spaced from the first opening 124 along the axis A. The fingers may be configured such that the ends contact the cable 110, which may assist in retaining the cable 110 in the cable gland 112.

The body 114 may include a tube 126 extending from the base 122 to an end 128 spaced from the base 122 along the axis A. The end 128 is disposed external to the cavity 106. That is, the tube 126 extends through the opening 108. The tube 126 extends annularly about the axis A. That is, the tube 126 defines a first cavity 130 extending axially therethrough. The first cavity 130 may be arranged coaxially with the axis A. The first cavity 130 may extend circumferentially about the axis A. A diameter of the first cavity 130 may be larger than the diameter of the first opening 124. The tube 126 may be configured to contact the wall 104, e.g., entirely, around the opening 108. That is, an outer diameter of the tube 126 may correspond to the diameter of the opening 108. The tube 126 may include a plurality of threads on an outer diameter thereof. The threads may be disposed at the end 128 of the tube 126. The threads may be spaced from the housing 102 when the base 122 contacts the wall 104.

The seal 118 is disposed external to the cavity 106. The seal 118 extends circumferentially about the tube 126. The seal 118 is configured to seal the tube 126 to the housing 102 entirely around the opening 108. For example, the seal 118 may be configured to contact the wall 104 and the tube 126 entirely around the opening 108. The seal 118 may be any suitable type of seal, e.g., an O-ring.

The cover 116 may include a top 132 extending about the axis A and a wall 134 extending from the top 132 axially along the axis A. The top 132 may include an second opening 136 extending therethrough. The second opening 136 may extend circumferentially about the axis A. A diameter of the second opening 136 may be smaller than the diameter the first opening 124. The diameter of the second opening 136 may, for example, be equal to the diameter of the cable 110 such that the top 132 may contact the cable 110, e.g., entirely, around the second opening 136. As another example, the diameter of the second opening 136 may be larger than the diameter of the cable 110. The top 132 may, at least partially, cover the insert 120. The second opening 136 may be arranged coaxially with the axis A.

The wall 134 may include a plurality of threads disposed on an inner axial side of the wall 134 relative to the axis A. The plurality of threads on the wall 134 may be configured to engage the plurality of threads on the tube 126. That is, the cover 116 may be threadedly engage with the body 114 via the threads on the tube 126 and the threads on the wall 134.

The wall 134 includes an end 138 spaced from the top 132 along the axis A. The end 138 is configured to compress the seal 118 against the housing 102 and the body 114 entirely around the opening 108. That is, the cover 116, the seal 118, and the body 114 seal the cable gland 112 around the opening 108. In other words, the cable gland 112 prevents fluid communication between the cavity 106 and the environment around the housing 102 via the opening 108.

The insert 120 is disposed in the first cavity 130. The insert 120 defines a second cavity 140 extending axially therethrough. The second cavity 140 may be arranged coaxially with the axis A. A diameter of the second cavity 140 is smaller than the diameter of the first opening 124. Additionally, the diameter of the second cavity 140 is smaller than the diameter of the second opening 136. The insert 120 may extend from the top 132 to the base 122. The insert 120 may, for example, contact the top 132 entirely about the second opening 136. The insert 120 may, for example, contact the base 122 entirely about the first opening 124. The insert 120 may further include a tab (not numbered) extending, at least partially, through the first opening 124. The tab may be compressed between the cable 110 and the base 122 in the first opening 124.

The insert 120 is configured to seal the cable 110 to the body 114. The insert 120 is designed, i.e., sized and shaped, to contact the cable 110 entirely about the axis A. The diameter of the second cavity 140 is smaller than a diameter of the cable 110 to assist in sealing the cable 110 to the body 114. Specifically, the second cavity 140 is configured to radially expand, e.g., via elastic deformation, to receive the cable 110 during installation of the cable 110 into the insert 120, which allows the insert 120 to radially compress the cable 110 when the cable 110 is installed into the insert 120. That is, a diameter of the second cavity 140 may be smaller in an uninstalled state (as shown in FIG. 3) than in an installed state (as shown in FIG. 2) of the cable gland 112.

The insert 120 includes a plurality of ribs 142 extending circumferentially about the axis A. The ribs 142 extend radially outward from an outer diameter of the insert 120. Each rib 142 may extend entirely about the insert 120 relative to the axis A. The ribs 142 are axially spaced from each other. An axial spacing between adjacent ribs 142 may be greater when the cable gland 112 is in an uninstalled state than when the cable gland 112 is in an installed state, i.e., prior to installation of the cable 110 into the insert 120. The ribs 142 may be radially aligned with each other, i.e., extend a same distance from the axis A.

The ribs 142 are configured to seal the insert 120 to the body 114. A diameter of the insert 120 at one of the ribs 142 is larger than a diameter of the first cavity 130. That is, the ribs 142 are configured to contact the tube 126 entirely about the axis A. During installation of the insert 120 into the first cavity 130, the ribs 142 are radially compressed against the tube 126. In this situation, the ribs 142 are configured to axially expand towards each other to accommodate the radial expansion of the insert 120 due to installation of the cable 110. That is, the axial spacing between the ribs 142 permits the ribs 142 to deform axially in response to being radially compressed by the tube 126. Said differently, the ribs 142 are configured to, during installation of the insert 120 to the body 114, compensate for deformation of the insert 120 resulting from installation of the cable 110 to the insert 120. In the installed state, one of the ribs 142 may contact the base 122 and/or another of the ribs 142 may contact the top 132. Additionally, or alternatively, at least some of the ribs 142 may be spaced from each other, or the ribs 142 may contact each other.

Configuring the insert 120 such that the second cavity 140 radially expands during installation of the cable 110 to the insert 120 can increase a likelihood of the insert 120 being sealed to the cable 110, e.g., due to radial compression of the insert 120 on the cable 110. Additionally, configuring the ribs 142 to axially expand during installation of the insert 120 to the body 114 allows the ribs 142 to accommodate the radial compression of the insert 120 by the tube 126, which can increase a likelihood of the insert 120 being sealed to the body 114. In other words, the insert 120 increases a likelihood of the cable gland 112 sealing the opening 108 around the cable 110.

The following should be viewed in light of FIGS. 1-3. The following describes an exemplary method of assembling the cable gland 112 to seal the cable 110 to the housing 102. the opening 108 may be designed to receive the cable gland 112. A first step provides the housing 102. A second step inserts the body 114 into the cavity 106. A third step inserts the tube 126 through the opening 108. A fourth step contacts the base 122 to the wall 104. A fifth step arranges the seal 118 around the tube 126. A sixth step provides the cable 110 and the insert 120. A seventh step routes the cable 110 through the second opening 136 of the cover 116. An eighth step inserts the cable 110 into the insert 120, which radially deforms the insert 120. A ninth step inserts the insert 120 into the tube 126, which axially deforms the ribs 142. A tenth step contacts the base 122 with the insert 120. An eleventh step threadedly engages the cover 116 with the tube 126. A twelfth step compresses the seal 118 against the housing 102 with the cover 116 and the insert 20 contacts the top 132 entirely about the second opening 136.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

LISTING OF REFERENCE CHARACTERISTICS 100 actuator
102 housing
104 wall
106 cavity
108 opening
110 cable
112 cable gland
114 body
116 cover
118 seal
120 insert
122 base
124 opening
126 tube
128 end
130 cavity
132 top
134 wall
136 opening
138 end
140 cavity
142 ribs A axis

What is claimed is:
1. A cable gland, comprising:
a body configured to be received in an opening of a housing, the body having a tube defining a first cavity extending circumferentially about an axis;
a cover threadedly engaged with the tube and configured to seal the body to the housing, the cover including a top having a further opening extending therethrough, and the further opening being arranged coaxially with the first cavity; and
an insert disposed in the first cavity and defining a second cavity configured to receive a cable, the insert: i)

directly contacting the top around the further opening, and ii) including a plurality of ribs engaged with the tube, and in an uninstalled state, a diameter of the second cavity is smaller than a diameter of the cable.

2. The cable gland of claim 1, wherein a diameter of the second cavity is smaller than a diameter of the first cavity.

3. The cable gland of claim 1, wherein the first cavity is arranged coaxially with the second cavity.

4. The cable gland of claim 1, wherein the second cavity and the further opening have smaller diameters than the first cavity.

5. The cable gland of claim 4, wherein the diameter of the second cavity is smaller than the diameter of the further opening.

6. The cable gland of claim 1, wherein the ribs are axially spaced from each other.

7. The cable gland of claim 1, wherein the ribs are configured to seal the insert to the tube.

8. The cable gland of claim 1, wherein the ribs are configured to contact the tube entirely about the axis.

9. The cable gland of claim 1, further comprising a seal extending circumferentially about the tube, the seal being configured to be compressed between the cover, the tube, and the housing.

10. The cable gland of claim 1, wherein each rib extends circumferentially about the axis.

11. The cable gland of claim 1, wherein the insert is configured to contact the cable entirely about the axis.

12. The cable gland of claim 1, wherein a diameter of the insert at one of the ribs is greater than a diameter of the first cavity.

13. The cable gland of claim 1, wherein the insert radially expands when the cable is inserted into the second cavity.

14. The cable gland of claim 1, wherein the ribs are axially spaced from each other, the ribs expanding axially when the insert is inserted into the first cavity.

15. A cable gland, comprising:
a body configured to be received in an opening of a housing, the body having a tube defining a first cavity extending circumferentially about an axis;
a cover threadedly engaged with the tube and configured to seal the body to the housing, the cover including a top having a further opening extending therethrough, and the further opening being arranged coaxially with the first cavity; and
an insert disposed in the first cavity and defining a second cavity configured to receive a cable, the insert: i) directly contacting the top around the further opening, and ii) including a plurality of ribs engaged with the tube, and
the body includes a base axially spaced from the cover and extending radially inward of the first cavity, one of the ribs being arranged to contact the base circumferentially about the axis.

16. The cable gland of claim 15, wherein the cover includes a top extending radially inward of the first cavity, the insert contacting the top circumferentially about the axis.

* * * * *